United States Patent
Hasegawa et al.

(10) Patent No.: US 6,252,269 B1
(45) Date of Patent: Jun. 26, 2001

(54) SEMICONDUCTOR MEMORY DEVICE

(75) Inventors: Masatomo Hasegawa; Masato Matsumiya; Satoshi Eto; Masato Takita; Toshikazu Nakamura; Ayako Kitamoto; Kuninori Kawabata; Hideki Kanou; Toru Koga; Yuki Ishii, all of Kawasaki (JP)

(73) Assignee: Fujitsu Limited, Kanagawa (JP)

( * ) Notice: Subject to any disclaimer, the term of this patent is extended or adjusted under 35 U.S.C. 154(b) by 0 days.

(21) Appl. No.: 09/422,860

(22) Filed: Oct. 25, 1999

(30) Foreign Application Priority Data

Dec. 14, 1998 (JP) .................................................. 10-355143

(51) Int. Cl.⁷ .................. H01L 27/108; H01L 29/76; H01L 31/119; H01L 29/00; H01L 27/082
(52) U.S. Cl. ........................ 257/306; 257/552; 257/565
(58) Field of Search .................................. 257/296–310, 257/552–565; 438/253–254, 396–398, 309–313, 342

(56) References Cited

U.S. PATENT DOCUMENTS

| | | | |
|---|---|---|---|
| 5,181,091 | * 1/1993 | Harrington et al. | 257/355 |
| 5,668,755 | * 9/1997 | Hidaka | 365/182 |
| 5,726,475 | * 3/1998 | Sawada et al. | 257/369 |
| 5,894,145 | * 4/1999 | Chen et al. | 257/301 |
| 6,025,621 | * 2/2000 | Lee et al. | 257/296 |

* cited by examiner

Primary Examiner—Tom Thomas
Assistant Examiner—Cuong Q Nguyen
(74) Attorney, Agent, or Firm—Armstrong, Westerman, Hattori, McLeland & Naughton, LLP

(57) ABSTRACT

According to a semiconductor memory for one aspect of the present invention, a memory cell transistor is formed in a P-type first well region which is formed at the surface of a P-type semiconductor substrate, and a back bias voltage is applied to the P-type first well region and the P-type substrate. Further, an N-type retrograde region is formed by implanting a high energy N-type impurity, so that a deeper, N-type second well region is formed by employing the N-type retrograde region. Further, a P-type third well region is formed in the N-type second well region, and a P-type emitter region is also formed therein. Thus, together the P-type emitter region, the N-type second well region, and the P-type third well region constitute a lateral PNP transistor. In addition, the ground voltage is maintained for the P-type third well region, which serves as a collector region.

6 Claims, 5 Drawing Sheets

Embodiment

Reference Voltage Generator

SEMICONDUCTOR MEMORY DEVICE

BACKGROUND OF THE INVENTION

1. Field of the Invention

The present invention relates to a semiconductor memory device, such as a dynamic RAM, and in particular to a semiconductor memory device which has a collector-grounded transistor and which prevents the leakage of an electric charge from a memory cell.

2. Related Arts

A dynamic RAM, which has a number of memory cells, each of which is constituted by a cell transistor and a cell capacitor, is widely employed as a large capacity high-speed memory. For such a memory device, a memory cell area wherein a plurality of memory cells are formed and an area wherein peripheral circuits are formed are provided at the surface of a semiconductor substrate. An MOS cell transistor, which is connected to a bit line and to a word line, and a cell capacitor, which is connected to the cell transistor, are formed in the memory cell area. A CMOS circuit, and a reference voltage generator, which employs a PNP bipolar transistor, are formed in the peripheral circuit formation area.

To provide a CMOS circuit as a peripheral circuit, for example, a P-type well region and an N-type well region are formed in a P-type semiconductor substrate, and an N-type channel MOS transistor and a P-type channel MOS transistor are formed in each well region. In the memory cell area, a back bias voltage, which is lower than the ground voltage, is applied to the channel region, so that a high threshold voltage is set for the cell transistor to reduce current leakage in the OFF state. Therefore, the memory cell area is formed in a P-type well region which is separated from a well region wherein the peripheral circuits are formed, and the back bias voltage is applied to the P-type well region.

FIG. 1 is a cross-sectional view of the structure of a conventional semiconductor memory device. A P-type well region P-WellA and an N-type well region N-WellB are formed in a P-sub semiconductor substrate 10. Although not shown, an N-type channel MOS transistor and a P-type channel MOS transistor are also formed in each well region. A P-type emitter region 12 and an N-type base contact region 13 are formed close to the P-type well region P-WellA in the N-type well region N-WellB, and a P-type collector contact region 14 is formed in the P-type well region P-WellA, so as to form a lateral PNP transistor. Such a lateral PNP transistor is employed as a reference voltage generator, as will be described later. In this case, the ground voltage is set for the collector contact region 14, and accordingly, the ground voltage is maintained for the P-type substrate 10.

A P-type well region P-WellC, which serves as the memory cell area, is formed in the N-type well region N-WellB, and is electrically separated from the P-type substrate 10. Therefore, in the P-type well region P-WellC a back bias voltage $V_{BB}$ is maintained, which is lower than the ground voltage. A drain region 15 and a source region 16 for a cell transistor Tc are formed in the P-type well region P-WellC, and a back bias voltage $V_{BB}$ is applied to the P-type well region P-WellC. A cell capacitor Qc is connected to the source region 16 of the cell transistor Tc.

In the conventional structure in FIG. 1, the P-type well region P-WellC, wherein a memory cell is provided, is formed in the N-type well region N-WellB using the ion implantation method and the thermal diffusion method. Therefore, the impurity concentration of the P-type well region P-WellC can not be very high. As a result, between the N-type source region 16 and the P-type well region P-WellC an energy barrier at a PN junction can not be set high, and the occurrence of current leakage can not be prevented.

The storage of information in a memory cell is performed whether or not an electric charge is accumulated in the cell capacitor Qc. Therefore, current leakage between the source region 16 and the P-type well region P-WellC results in the loss of stored information during a refresh cycle. In order to prevent the loss of data, the refresh cycle must be shortened.

SUMMARY OF THE INVENTION

It is one objective of the present invention to provide a semiconductor memory device for which a current leakage characteristic of a memory cell is enhanced.

It is another objective of the present invention to provide a new structure for a semiconductor memory, in which a PNP transistor having a grounded collector is provided as a peripheral circuit and for which the current leakage characteristic of the memory cell is improved.

To achieve the above objectives, according to a semiconductor memory for one aspect of the present invention, a memory cell transistor is formed in a P-type first well region which is formed at the surface of a P-type semiconductor substrate, and a back bias voltage is applied to the P-type first well region and the P-type substrate. Further, an N-type retrograde region is formed by implanting a high energy N-type impurity, so that a deeper, N-type second well region is formed by employing the N-type retrograde region. Further, a P-type third well region is formed in the N-type second well region, and a P-type emitter region is also formed therein. Thus, together the P-type emitter region, the N-type second well region, and the P-type third well region constitute a lateral PNP transistor. In addition, the ground voltage is maintained for the P-type third well region, which serves as a collector region.

With this structure, unlike the prior art, the P-type first well region, which serves as a memory cell area, is not formed in an N-type well region, so that the first well region having high impurity concentration can be provided and current leakage at a junction in a cell transistor can be reduced. Furthermore, since the deeper, N-type second well region is formed by implanting the high energy N-type impurity, a high temperature annealing process is not required, a semiconductor wafer having a large diameter can be employed, and the manufacturing costs can be reduced. Also, the P-type well region, which constitutes the collector for the PNP transistor, can be separated from the substrate, and for it the ground voltage can be maintained.

To achieve the above objectives, according to another aspect of the present invention, a semiconductor memory device having a memory cell, which includes a cell transistor connected to both a bit line and a word line, and a cell capacitor connected to the cell transistor, and a PNP transistor having at the least a grounded collector, comprises:

a P-type semiconductor substrate;

a P type first well region, which is formed at the surface of the P-type semiconductor substrate;

an N type second well region, which is formed at the surface of the semiconductor substrate and is adjacent to the first well region, and which is deeper than the first well region;

a P type third well region, which is formed in the second well region and connected to a ground voltage; and a P-type emitter region, which is formed in the second well region and separated from the third well region by a predetermined distance, wherein the first well region is connected to a back bias voltage level lower than the ground voltage, and the cell transistor is formed in the first well region, and wherein the P type third well region, the P-type emitter region and the N type second well region constitute the PNP transistor.

DETAILED DESCRIPTION OF THE PREFERRED EMBODIMENT

The preferred embodiment of the present invention will now be described while referring to the accompanying drawings. It should be noted, however, that the technical scope of the present invention is not limited to this embodiment.

Figure 1:
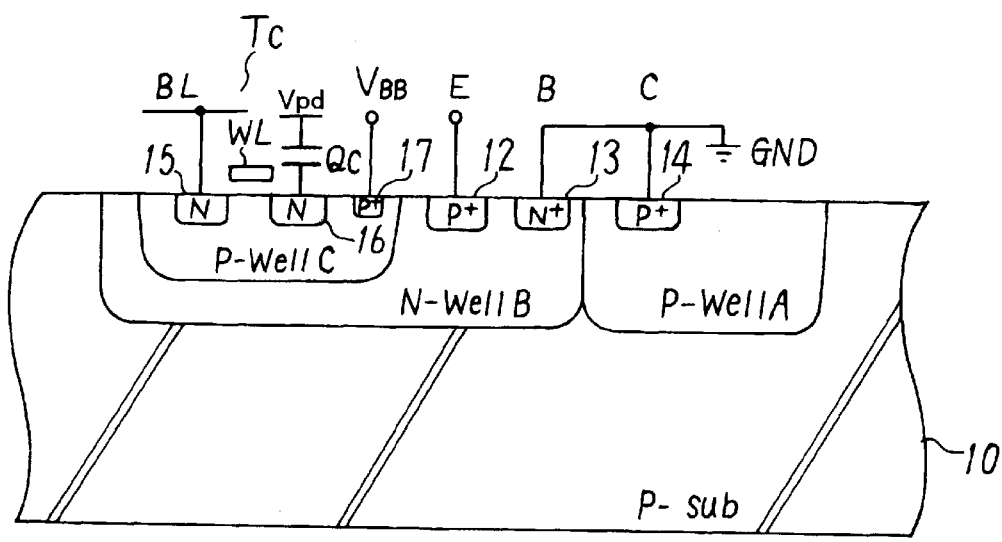
FIG. 1 is a cross-sectional view of a conventional semiconductor memory device.
Figure 2:
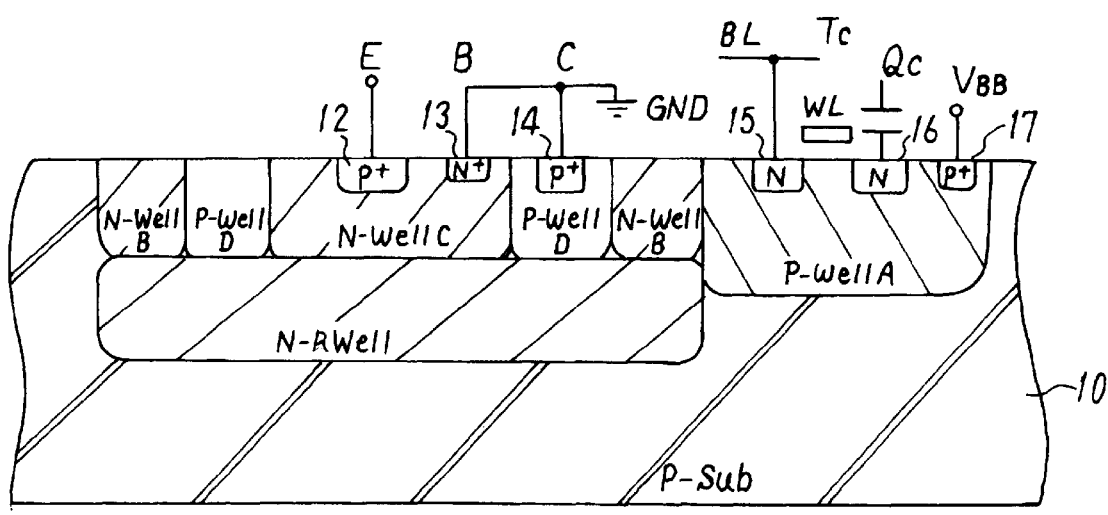
FIG. 2 is a cross-sectional view of a semiconductor memory device according to one embodiment of the present invention.
Figure 3:
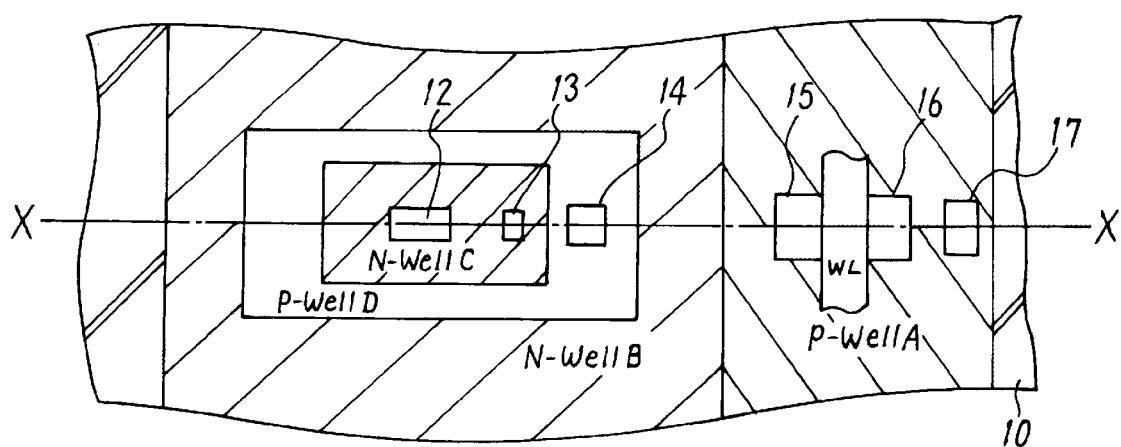
FIG. 3 is a plan view for FIG. 2.

FIG. 2 is a cross-sectional view of a semiconductor memory device according to one embodiment of the present invention, and FIG. 3 is a corresponding plan view. The cross section taken along X—X in FIG. 3 is shown in FIG. 2. In this embodiment, a P type first well region P-WellA is formed at the surface of a P-type substrate 10, and a memory cell is formed in the well region. That is, an N-type drain region 15 and a source region 16 of a cell transistor Tc are formed in the P type first well region P-WellA, and a back bias voltage $V_{BB}$, which is lower than a ground voltage, is applied to the first well region P-WellA via a P-type contact region 17. Accordingly, the back bias voltage is also maintained for the P-type substrate 10. Normal ion implantation energy is employed to form the first well region P-WellA at the surface of the P-type substrate 10 using the ion implantation method, and as a result, an impurity having a sufficiently high concentration can be implanted, a satisfactorily high barrier can be located at a PN junction between the source region 16 and the first well region P-WellA, which serves as a channel region, and the current leakage that occurs at the junction can be reduced.

The gate of the cell transistor Tc is connected to a word line WL; a capacitor Qc is connected to the source region 16; and the drain region 15 is connected to a bit line BL.

Peripheral circuits other than the memory cell are formed in the N type second well regions N-WellB and N-WellC and in the P type third well region P-WellD, which are formed in the second well regions. In FIGS. 2 and 3, a lateral PNP bipolar transistor is shown which is formed by the second well regions and the third well region. In FIGS. 2 and 3, the second well regions N-WellB and N-WellC are separated via the rectangular, third well region P-WellD. The well regions N-WellB and N-WellD are then linked together by an N-type retrograde region N-RWell which is deeply embedded in the substrate 10 so that the N type second well region N-WellB, C, N-RWell is deeper than the P type first well region P-WellA.

Therefore, the shallower third well region P-WellD is formed in the N type second well region N-WellB, C, N-RWell. A P-type emitter region 12 and an N-type base contact region 13 for the lateral bipolar transistor are formed in the center of the N-type well region N-WellC. A collector contact region 14 is formed in the third well region P-WellD, and together with the base is connected to the ground voltage GND. Therefore, the third well region P-WellD is maintained at a ground voltage level. It should be noted that the third well region P-WellD is electrically separated from the P-type substrate 10 by the N-type well region N-WellB and the N-type retrograde region N-RWell.

Although not shown in FIGS. 2 and 3, a P-type channel transistor is formed as a peripheral circuit in the second well regions N-WellB and N-WellC, and an N-type channel transistor is formed as a peripheral circuit in the third well region P-WellD.

Figure 4:
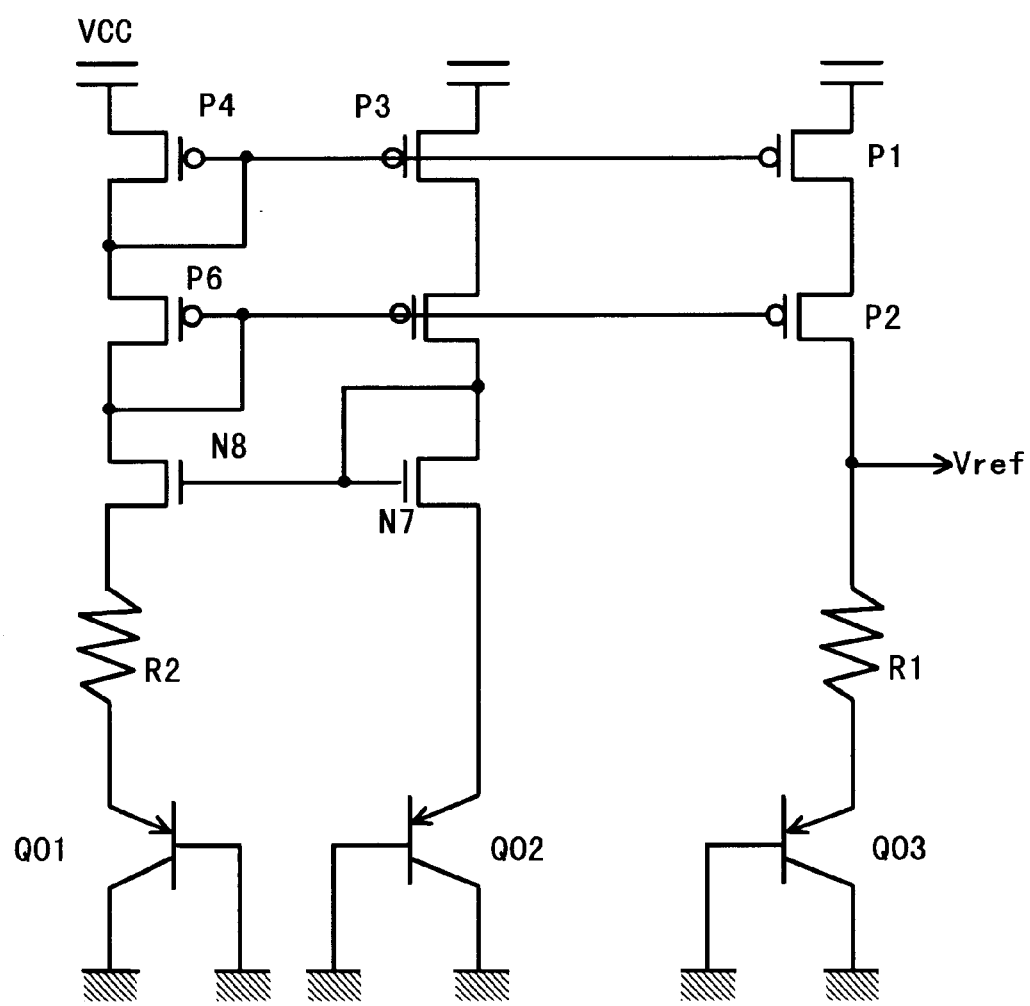
FIG. 4 is a diagram illustrating a reference voltage generator according to the embodiment of the present invention which employs a bipolar transistor.

FIG. 4 is a diagram illustrating a reference voltage generator which employs the bipolar transistor of the embodiment of the present invention. The reference voltage generator comprises PNP transistors Q01, Q02 and Q03, the bases and collectors of which are all grounded; resistors R1 and R2; P-type channel transistors P1 to P6; and N-type channel transistors N7 and N8. A constant reference voltage Vref is applied at the point at which the resistor RI and the P-type channel transistor P2 are connected. The reference voltage generator generates a constant current by using a current mirror circuit, which is constituted by the transistors P3 to P6, in consonance with a constant voltage which is generated by using a band gap voltage $V_{BE}$ between the bases and the emitters of the PNP transistors. The obtained current is supplied via the transistors P1 and P2 to the resistor R1, and the constant reference voltage Vref is generated at the output terminal. This reference voltage Vref is employed, for example, as a reference voltage for an input buffer.

The PNP transistors in FIG. 4 correspond to the transverse PNP transistors in FIGS. 2 and 3. The P-type channel transistors and N-type channel transistors in FIG. 4 are provided in the N-type second well region N-wellB and the P-type third well region P-WellD in the peripheral circuit area of the memory.

FIGS. 5A to 5D are cross-sectional views of a method for manufacturing the semiconductor memory device according to this embodiment, and FIGS. 6A to 6D are corresponding plan views.

Figure 5A:
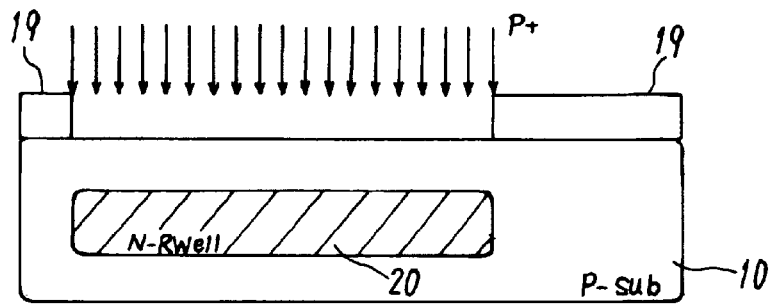
FIGS. 5A to 5D are cross-sectional views of the processing performed when manufacturing the semiconductor memory device according to the embodiment of the present invention.
Figure 6A:
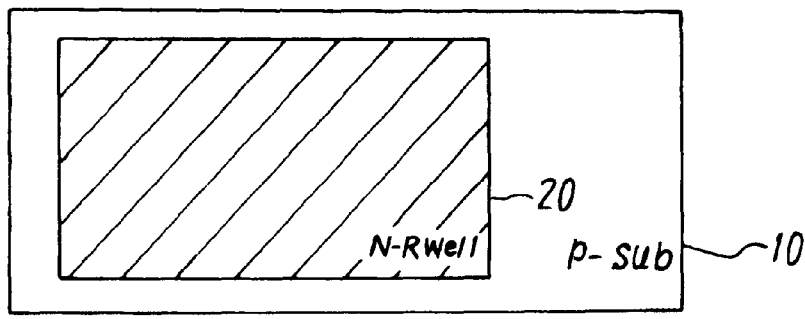
FIGS. 6A to 6D are plan views of FIG. 5.

First, as is shown in FIGS. 5A and 6A, a resist layer 19 is formed on the surface of a P-type silicon semiconductor substrate having an impurity concentration of approximately $1.0 \times 10^{15}/cm^2$, and an opening is formed at a position corresponding to a retrograde region using normal lithography. While using the resist layer 19 as a mask, a phosphorus P, for example, is implanted with dose of $1.5 \times 10^{13}/cm^2$ at a high energy of 600 KeV. As a result, a retrograde region 20 is embedded in the substrate 10 at a depth of approximately 1 μm and the use of a high-temperature annealing process is not required following the ion implantation. In a profile of the retrograde region N-RWell, the impurity concentration is reduced in the direction extending from its deepest position in the substrate 10 toward its surface. Therefore, the surface of the P-type substrate above the retrograde region is maintained exactly or substantially the same as in its initial state.

Figure 5B:
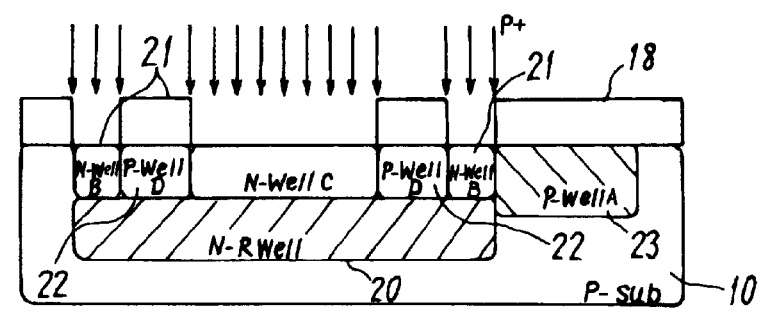
Figure 6B:
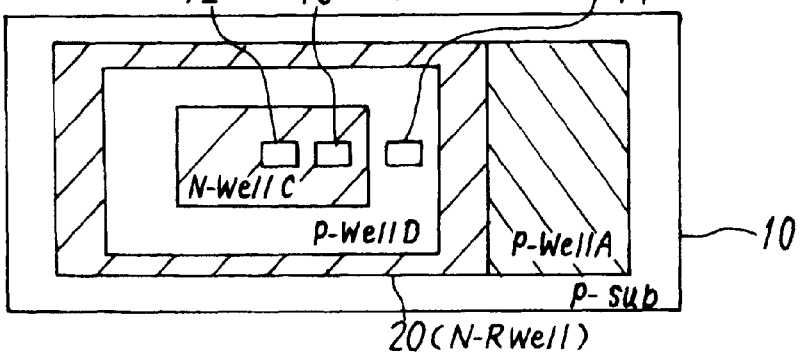

Following this, as is shown in FIGS. 5B and 6B, another resist layer 18 is formed using lithography around the circumference of and at locations inside the retrograde region 20. While using the resist layer 18 as a mask, a phosphorus P, for example, is implanted with dose of $3.0 \times 10^{12}/cm^2$ at an energy of 100 KeV, and N-type well regions 21 (N-WellB and N-WellC) are formed. These well regions 21 are connected to the embedded retrograde region 20, and thereby form the N-type second well region.

In addition, a mask film (not shown) is formed, and, a boron B, for example, is implanted with dose of $1.5 \times 10^{13}/cm^2$ at an energy of 150 KeV. As a result, the P-type third well region 22 (P-WellD) and the P-type first well region 23 (P-WellA) are formed.

A cell transistor is formed later in the P-type first well region P-WellA, and a back bias voltage VBB is applied thereto. The P-type first well region P-WellA is formed by ion implantation at a lower energy than that used for the retrograde region 20, and is more shallowly positioned than the retrograde region 20. Since the P-type first well region P-WellA is formed directly in the surface of the P-type substrate 10, the density of the impurity can be approximately $3.0 \times 10^{17}/cm^{12}$, which is satisfactorily high.

Figure 5C:
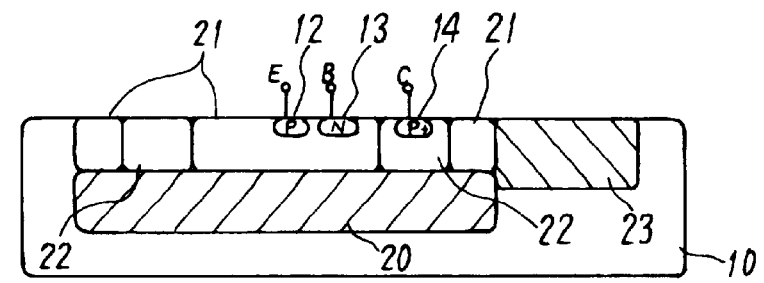
Figure 6C:
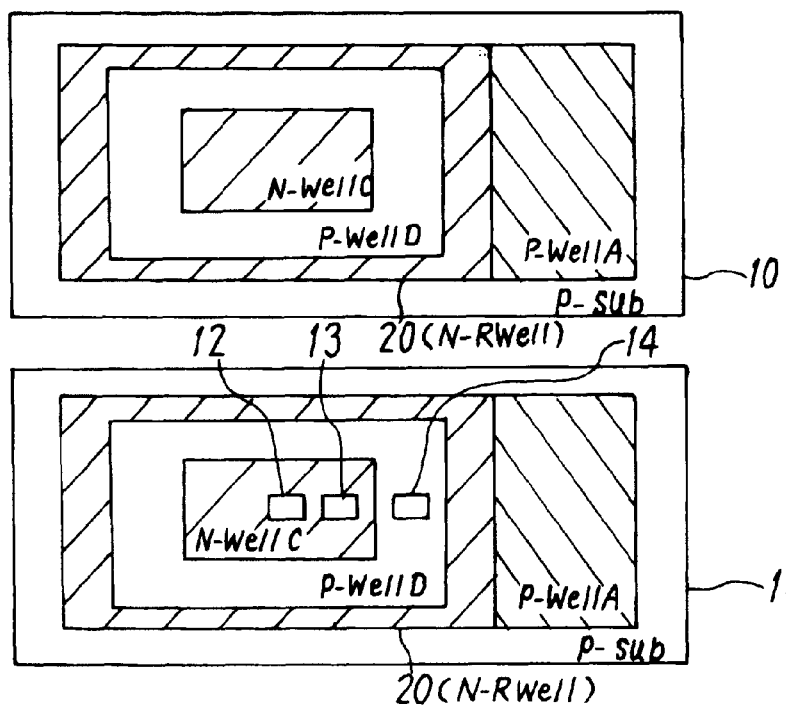

As is shown in FIGS. 5C and 6C, while employing as a mask a resist layer formed using normal lithography, a P-type emitter region 12 is formed in the N-type well region N-WellC and a collector contact region 14 is formed in the P-type third well region P-WellD. Furthermore, while employing another resist layer as a mask, a base contact region 13 is formed in the N-type well region N-WellC.

Figure 5D:
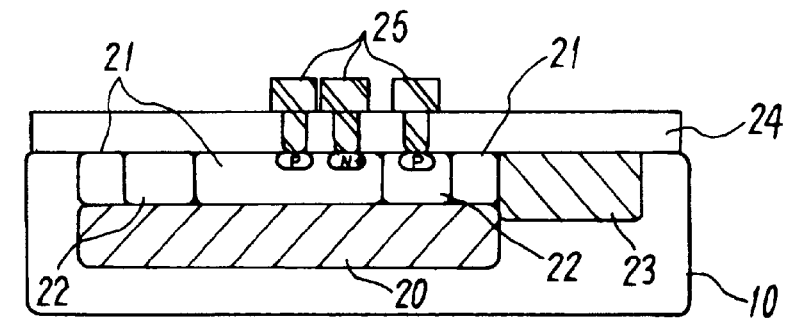
Figure 6D:
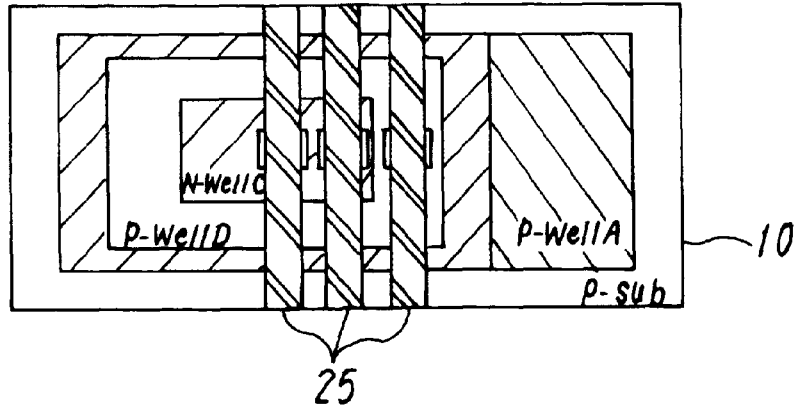

Finally, as is shown in FIGS. 5D and 6D, a silicon oxide film 24 is formed on the surface of the substrate 10; contact holes are opened in the film 24 at locations corresponding to the emitter region 12, the base contact region 13 and the collector contact region 14; and electrodes 25 are formed which cover the holes. Then, the collector and the base are grounded.

Although not shown in FIGS. 5 and 6, the N-type channel MOS transistor Tc is formed as a cell transistor in the P-type first well region 23 (P-WellA), as is shown in FIG. 2. In addition, a contact region for the back bias voltage is formed.

As is described above, according to this embodiment, a semiconductor memory device having an optimal structure can be provided by employing the technique for forming an N-type retrograde region. That is, since the retrograde region is formed by ion implantation at high energy, an annealing process performed at a high temperature is not required, and the deep, N-type second well region can be formed. In addition, a P-type third well region can be formed in the second well region by ion implantation performed at a low energy, and a high-temperature annealing process is also not required for the formation of the third well region. Furthermore, when a high impurity density is employed, the P-type first well region can be formed directly in the surface of the P-type substrate.

With the above described structure, when a high impurity density is maintained in the P-type first well region P-WellA, whereat a cell transistor is to be formed, and a back bias voltage is applied thereto, a high threshold voltage can be set for the cell transistor so as to reduce off-leak current, and the leak current from the source region to the P-type first well region P-WellA can also be reduced. In addition, the PNP transistor can be constituted by the N-type second well region and the P-type third well region formed therein, and the P-type third well region P-WellD, which is electrically separated from the P-type substrate, can be maintained at the ground voltage level.

Since, as is described above, a high-temperature annealing process is not required, the above described structure can be applied for a large diameter silicon wafer; one, for example, having a diameter of 12 inches. Therefore, the manufacturing costs per chip can be considerably reduced.

As is described above, according to the present invention a semiconductor memory device can be provided for which the current leakage characteristic of a memory cell is enhanced, and wherein a PNP transistor having a grounded collector can be provided as a peripheral circuit.

What is claimed is:

1. A semiconductor memory device having a memory cell, which includes a cell transistor connected to both a bit line and a word line, and a cell capacitor connected to said cell transistor, and a PNP transistor having at the least a grounded collector, comprising:

a P-type semiconductor substrate;

a P type first well region, which is formed at the surface of said P-type semiconductor substrate;

an N type second well region, which is formed at the surface of said semiconductor substrate and is adjacent to said first well region, and which is deeper than said first well region;

a P type third well region, which is formed in said second well region and connected to a ground voltage; and a P-type emitter region, which is formed in said second well region and separated from said third well region by a predetermined distance, wherein said first well region is connected to a back bias voltage level lower than said ground voltage, and said cell transistor is formed in said first well region, and wherein said P type third well region, said P-type emitter region and said N-type second well region constitute said PNP transistor.

2. A semiconductor memory device according to claim 1, wherein said second well region includes an N-type retrograde region embedded in said substrate at a predetermined depth, and an N-type well region which extends from the surface of said substrate to said retrograde region.

3. A semiconductor memory device according to claim 1, wherein said P-type emitter region is surrounded by said P-type third well region.

4. A semiconductor memory device according to claim 2, wherein said P-type emitter region is surrounded by said P-type third well region.

5. A semiconductor memory device according to claim 1, further comprising a reference voltage generator for generating a predetermined reference voltage by employing a voltage corresponding to a bandgap for a PN junction, wherein said reference voltage generator includes said PNP transistor.

6. A semiconductor memory device according to claim 2, further comprising a reference voltage generator for generating a predetermined reference voltage by employing a voltage corresponding to a bandgap for a PN junction, wherein said reference voltage generator includes said PNP transistor.

* * * * *